United States Patent
Kawashima

(10) Patent No.: US 10,699,997 B2
(45) Date of Patent: Jun. 30, 2020

(54) SEMICONDUCTOR DEVICE

(71) Applicant: Denso Corporation, Kariya, Aichi-pref (JP)

(72) Inventor: Takanori Kawashima, Anjo (JP)

(73) Assignee: Denso Corporation, Kariya, Aichi-pref (JP)

( * ) Notice: Subject to any disclaimer, the term of this patent is extended or adjusted under 35 U.S.C. 154(b) by 0 days.

(21) Appl. No.: 16/260,552

(22) Filed: Jan. 29, 2019

(65) Prior Publication Data
US 2019/0252307 A1    Aug. 15, 2019

(30) Foreign Application Priority Data
Feb. 9, 2018 (JP) ................. 2018-022368

(51) Int. Cl.
| | |
|---|---|
| *H01L 23/498* | (2006.01) |
| *H01L 25/07* | (2006.01) |
| *H01L 23/00* | (2006.01) |
| *H01L 23/373* | (2006.01) |
| *H01L 23/31* | (2006.01) |
| *H01L 23/482* | (2006.01) |
| *H01L 23/051* | (2006.01) |
| *H01L 23/495* | (2006.01) |
| *H01L 25/18* | (2006.01) |

(52) U.S. Cl.
CPC ...... *H01L 23/49844* (2013.01); *H01L 23/051* (2013.01); *H01L 23/3121* (2013.01); *H01L 23/3736* (2013.01); *H01L 23/4822* (2013.01); *H01L 23/49562* (2013.01); *H01L 24/33* (2013.01); *H01L 25/072* (2013.01); *H01L 23/3107* (2013.01); *H01L 25/18* (2013.01)

(58) Field of Classification Search
CPC ............ H01L 23/3736; H01L 23/3107; H01L 23/49562
See application file for complete search history.

(56) References Cited

U.S. PATENT DOCUMENTS

| | | | |
|---|---|---|---|
| 6,836,006 B2 * | 12/2004 | Muto ...................... | H01L 24/73 257/686 |
| 2007/0018197 A1 * | 1/2007 | Mochida ............... | H01L 25/105 257/177 |

(Continued)

FOREIGN PATENT DOCUMENTS

JP    2015-053343 A    3/2015

*Primary Examiner* — Mohammed Shamsuzzaman
*Assistant Examiner* — Khatib A Rahman
(74) *Attorney, Agent, or Firm* — Dinsmore & Shohl LLP

(57) ABSTRACT

A semiconductor device includes: a first semiconductor element; a first conductor plate laminated on the first semiconductor element and connected to the first semiconductor element; a first power terminal connected to the first conductor plate, the first power terminal including a body portion extending in a first direction and a joining portion extending in a second direction different from the first direction, the joining portion being connected to the first conductor plate; and a sealing body configured to seal the first semiconductor element, the first conductor plate, the joining portion, and a part of the body portion, the sealing body having a first surface that is a surface from which the body portion projects and a second surface that is a surface placed on an opposite side of the sealing body from the first surface.

13 Claims, 5 Drawing Sheets

(56) References Cited

U.S. PATENT DOCUMENTS

| | | | |
|---|---|---|---|
| 2014/0110752 A1* | 4/2014 | Fujino | H01L 23/492 257/133 |
| 2014/0362540 A1* | 12/2014 | Hatasa | H05K 3/306 361/728 |
| 2016/0225690 A1 | 8/2016 | Kadoguchi et al. | |
| 2016/0315037 A1* | 10/2016 | Kadoguchi | H01L 23/49562 |
| 2018/0218960 A1* | 8/2018 | Takahagi | H01L 23/49575 |
| 2019/0318999 A1* | 10/2019 | Kawashima | H01L 23/50 |

* cited by examiner

SEMICONDUCTOR DEVICE

CROSS-REFERENCE TO RELATED APPLICATIONS

This application claims priority to Japanese Patent Application No. 2018-022368 filed on Feb. 9, 2018, which is incorporated herein by reference in its entirety including the specification, drawings and abstract.

BACKGROUND

1. Technical Field

A technique disclosed in the present specification relates to a semiconductor device.

2. Description of Related Art

A semiconductor device is described in Japanese Unexamined Patent Application Publication No. 2015-53343 (JP 2015-53343 A). The semiconductor device includes a plurality of power terminals. One of the power terminals is joined to a conductor plate inside a sealing body.

SUMMARY

In the semiconductor device, the power terminal joined to the conductor plate includes a body portion extending inside and outside the sealing body, and a joining portion joined to the conductor plate inside the sealing body. The body portion and the joining portion extend along the same direction. The disclosure provides a technique that can improve the fixing strength of such a power terminal by a sealing body.

A semiconductor device according to a first aspect of the disclosure includes: a first semiconductor element; a first conductor plate laminated on the first semiconductor element and connected to the first semiconductor element; a first power terminal connected to the first conductor plate, the first power terminal including a body portion extending in a first direction and a joining portion extending in a second direction different from the first direction, the joining portion being connected to the first conductor plate; and a sealing body configured to seal the first semiconductor element, the first conductor plate, the joining portion, and a part of the body portion, the sealing body having a first surface that is a surface from which the body portion projects and a second surface that is a surface placed on an opposite side of the sealing body from the first surface.

In the above aspect, the joining portion of the first power terminal extends in a direction different from the body portion of the first power terminal. Hereby, the joining portion extending in the direction different from the body portion functions like an anchor inside the sealing body. Hereby, even when a large tensile force is applied to the body portion projecting outside the sealing body, the first power terminal is firmly held by the sealing body. That is, the fixing strength of the first power terminal by the sealing body improves.

In the above aspect, the joining portion may be placed between the first surface of the sealing body and the first conductor plate in a plan view.

In the above aspect, the joining portion is provided to be relatively long, so that the fixing strength of the first power terminal by the sealing body can be further raised. The "plan view" as used herein indicates a case where the semiconductor device is viewed along a direction where the first semiconductor element and the first conductor plate are laminated (that is, a direction perpendicular to the first conductor plate and the first semiconductor element) and a positional relationship in this direction is ignored.

In the above aspect, the semiconductor device may further include a first signal terminal projecting from the second surface of the sealing body, the first signal terminal being connected to the first semiconductor element inside the sealing body.

In the above aspect, the first signal terminal is placed so as to be distanced from the first power terminal. Accordingly, it is possible to restrain occurrence of noise in the first signal terminal due to a current flowing through the first power terminal.

In the above aspect, the semiconductor device may further include a second conductor plate sealed by the sealing body, the second conductor plate facing the first conductor plate across the first semiconductor element, the second conductor plate being connected to the first conductor plate via the first semiconductor element; and a second power terminal projecting from the first surface of the sealing body, the second power terminal being connected to the second conductor plate inside the sealing body. At least a part of the joining portion may be placed between the body portion and the second power terminal in a plan view.

In the above aspect, a distance between the body portion of the first power terminal and the second power terminal (particularly, a creeping distance along the first surface of the sealing body) is increased, so that an insulating property between the body portion of the first power terminal and the second power terminal can be raised.

In the above aspect, the semiconductor device may further include a second semiconductor element sealed by the sealing body; a third conductor plate laminated on the second semiconductor element, the third conductor plate being connected to the second semiconductor element inside the sealing body; a fourth conductor plate facing the third conductor plate across the second semiconductor element, the fourth conductor plate being connected to the third conductor plate via the second semiconductor element; and a third power terminal projecting from the first surface of the sealing body, the third power terminal being connected to the fourth conductor plate inside the sealing body, wherein the first power terminal is placed between the second power terminal and the third power terminal in the plan view.

In the above aspect, the second power terminal and the third power terminal are placed so as to sandwich the first power terminal, so that the structural symmetry of the semiconductor device across the first power terminal is raised. Hereby, the fixing strength of the first power terminal by the sealing body improves significantly. Here, the first power terminal, the second power terminal, and the third power terminal may be placed on the same plane in at least their respective parts passing through the first surface of the sealing body, although the first power terminal, the second power terminal, and the third power terminal are not limited to this.

In the above aspect, the third conductor plate may be connected to the second conductor plate via a joint; and the joint may be placed between the second conductor plate and the third conductor plate and is placed between the first surface and a straight line passing through a center of the first semiconductor element and a center of the second semiconductor element in the plan view.

In the above aspect, the joint is placed near the power terminals. Accordingly, a path for a current flowing between two power terminals via the joint becomes short, thereby making it possible to restrain a loss caused in the semiconductor device and heat generation caused due to the loss, for example.

In the above aspect, the semiconductor device may further include a second signal terminal projecting from the second surface of the sealing body, the second signal terminal being connected to the second semiconductor element inside the sealing body.

In the above aspect, the second signal terminal is placed so as to be distanced from the power terminals. Accordingly, it is possible to restrain occurrence of noise in the second signal terminal due to a current flowing through the power terminals.

In the above aspect, a shape of the first conductor plate and a shape of the third conductor plate may be the same; and the first conductor plate may be placed at an angle 90 degrees shifted from the third conductor plate.

In the above aspect, common components are used, so that a manufacturing cost of the semiconductor device can be reduced, for example.

In the above aspect, the joining portion may be provided in a first end that is one end of the body portion; the joining portion may extend from a first side which is one side of the first end in an orthogonal direction to the first direction; and the other side of the first end in the orthogonal direction to the first direction may be chamfered.

When a chamfer is formed in the one end of the body portion, an adhesion property between the first power terminal and the sealing body increases, so that the fixing strength of the first power terminal by the sealing body becomes higher.

In the above aspect, the second direction may be generally perpendicular to the first direction. Note that "generally perpendicular" as used in the present specification indicates that a deviation of 10 degrees or less from an exact perpendicular state is allowable.

In the above aspect, the first power terminal may have a plate-shape; and the second direction may be generally perpendicular to a thickness direction of the first power terminal.

In the above aspect, when a tensile force is applied to the first power terminal, for example, the joining portion can hardly deform with respect to the body portion, so that the first power terminal is firmly fixed to the sealing body.

In the above aspect, the first power terminal may be formed integrally with the first conductor plate.

A semiconductor device according to a second aspect of the disclosure includes: a first semiconductor element; a first conductor plate laminated on the first semiconductor element and connected to the first semiconductor element; a first power terminal connected to the first conductor plate, the first power terminal including a body portion extending in a first direction, the body portion being connected to the first conductor plate; a sealing body configured to seal the first semiconductor element, the first conductor plate, and a part of the body portion, the sealing body having a first surface that is a surface from which the body portion projects; a second conductor plate sealed by the sealing body, the second conductor plate facing the first conductor plate across the first semiconductor element, the second conductor plate being connected to the first conductor plate via the first semiconductor element; a second power terminal projecting from the first surface of the sealing body, the second power terminal being connected to the second conductor plate inside the sealing body; a second semiconductor element sealed by the sealing body; a third conductor plate laminated on the second semiconductor element, the third conductor plate being connected to the second semiconductor element inside the sealing body; a fourth conductor plate facing the third conductor plate across the second semiconductor element, the fourth conductor plate being connected to the third conductor plate via the second semiconductor element; and a third power terminal projecting from the first surface of the sealing body, the third power terminal being connected to the fourth conductor plate inside the sealing body, wherein: the first power terminal is placed between the second power terminal and the third power terminal in a plan view; the third conductor plate is connected to the second conductor plate via a joint; and the joint is placed between the second conductor plate and the third conductor plate and is placed between the first surface and a straight line passing through a center of the first semiconductor element and a center of the second semiconductor element in the plan view.

A semiconductor device according to a third aspect of the disclosure includes a first semiconductor element; a first conductor plate laminated on the first semiconductor element; a first power terminal including a body portion extending in a first direction, the first power terminal being connected to the first conductor plate; a second conductor plate laminated on the first semiconductor element, the second conductor plate facing the first conductor plate across the first semiconductor element; a second power terminal extending in the first direction, the second power terminal being connected to the second conductor plate on a side, in the first direction, where the first power terminal is connected to the first conductor plate; a first signal terminal connected to the first semiconductor element on an opposite side, in the first direction, from the side where the first power terminal is connected to the first conductor plate; a second semiconductor element separated from the first semiconductor element; a third conductor plate laminated on the second semiconductor element on aside, in a laminating direction, where the first conductor plate is laminated on the first semiconductor element, the laminating direction being a direction where the first semiconductor element and the first conductor plate are laminated, the third conductor plate being connected to the second conductor plate via a joint, the joint being placed between the first power terminal and a straight line passing through a center of the first semiconductor element and a center of the second semiconductor element in the first direction; a fourth conductor plate laminated on the second semiconductor element, the fourth conductor plate facing the third conductor plate across the second semiconductor element; and a third power terminal extending in the first direction, the third power terminal being connected to the fourth conductor plate on the side, in the first direction, where the first power terminal is connected to the first conductor plate.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
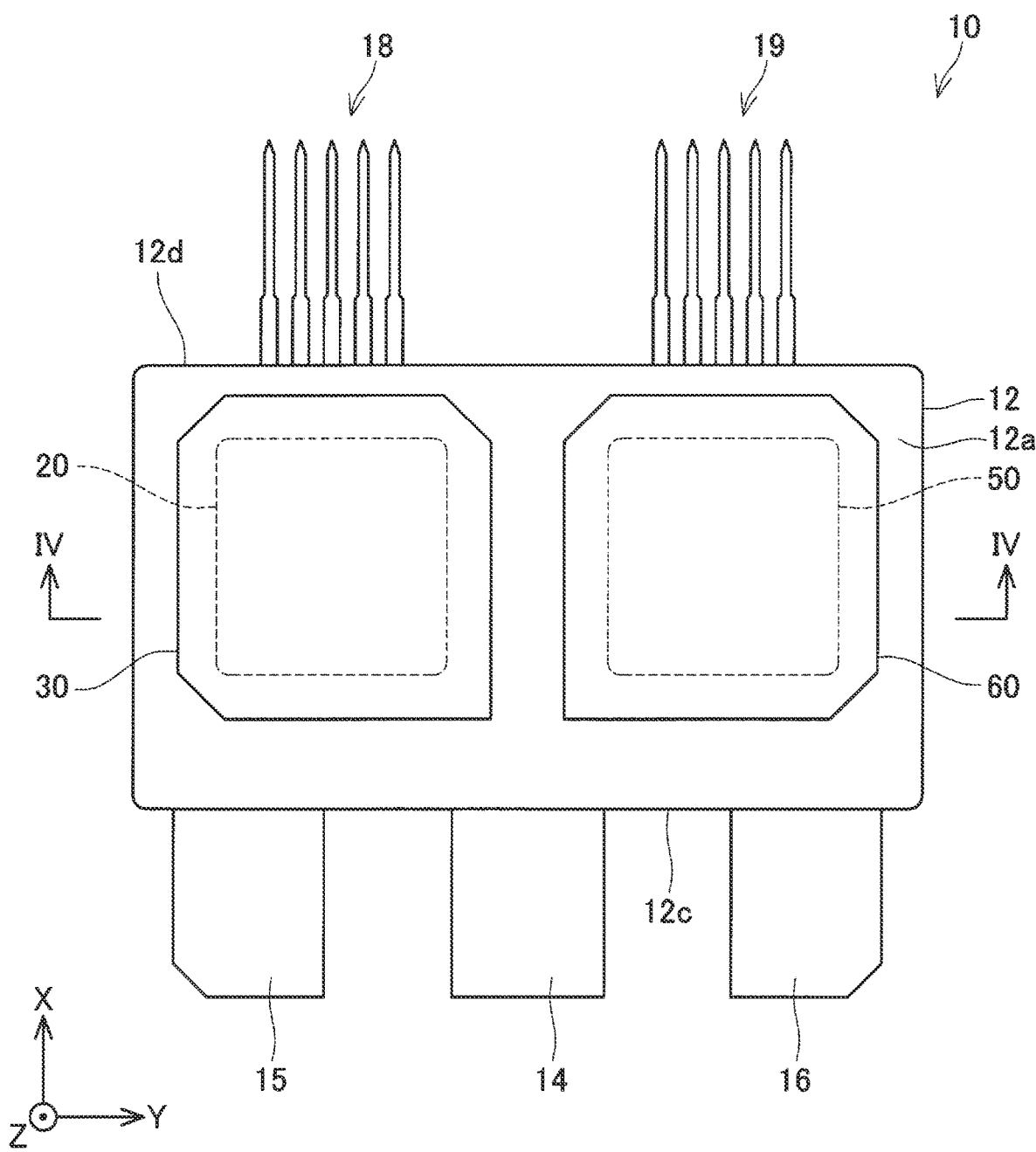
FIG. 1 illustrates a plan view of a semiconductor device 10 of Embodiment 1.

A semiconductor device 10 according to an embodiment will be described with reference to the drawings. The semiconductor device 10 of the present embodiment is a power semiconductor device and can be used for a power converter circuit such as a converter or an inverter in an electrically-driven vehicle such as an electric vehicle, a hybrid vehicle, or a fuel-cell vehicle. Note that the purpose of the semiconductor device 10 is not limited particularly. The semiconductor device 10 can be widely used for various devices and circuits.

As illustrated in FIGS. 1 to 4, the semiconductor device 10 includes a first semiconductor element 20, a second semiconductor element 50, a sealing body 12, and a plurality of terminals 14, 15, 16, 18, 19. The first semiconductor element 20 and the second semiconductor element 50 are placed side by side in a lateral direction and sealed inside the sealing body 12. The sealing body 12 is not limited in particular, but the sealing body 12 is made of thermosetting resin such as epoxy resin, for example. Each of the terminals 14, 15, 16, 18, 19 extends inwardly from outside the sealing body 12 so as to be electrically connected to at least either one of the first semiconductor element 20 and the second semiconductor element 50 inside the sealing body 12. The terminals 14, 15, 16, 18, 19 include a first power terminal 14, a second power terminal 15, a third power terminal 16, a plurality of first signal terminals 18, and a plurality of second signal terminals 19.

Three power terminals 14, 15, 16 project from a first side face 12c of the sealing body 12. The three power terminals 14, 15, 16 are parallel to each other and extend along a first direction X. Further, the three power terminals 14, 15, 16 are arranged along a second direction Y that is perpendicular to the first direction X. The power terminals 14, 15, 16 are generally plate-shaped members and are placed on the same plane in at least their respective parts passing through the first side face 12c of the sealing body 12. In the meantime, the first signal terminals 18 and the second signal terminals 19 project from a second side face 12d of the sealing body 12. The second side face 12d is placed on the opposite side of the sealing body 12 from the first side face 12c. The first signal terminals 18 and the second signal terminals 19 are arranged along the second direction Y. The first signal terminals 18 and the second signal terminals 19 are placed on the same plane in at least their respective parts passing through the second side face 12d of the sealing body 12.

The first semiconductor element 20 and the second semiconductor element 50 are power semiconductor elements and have the same configuration. The first semiconductor element 20 includes a semiconductor substrate 22, a front-surface electrode 24, a back-surface electrode 26, and a plurality of signal electrodes 28. The front-surface electrode 24 and the signal electrodes 28 are provided on a first principal face of the semiconductor substrate 22, and the back-surface electrode 26 is provided on a second principal face of the semiconductor substrate 22. Similarly, the second semiconductor element 50 includes a semiconductor substrate 52, a front-surface electrode 54, a back-surface electrode 56, and a plurality of signal electrodes 58. The front-surface electrode 54 and the signal electrodes 58 are provided on a first principal face of the semiconductor substrate 52, and the back-surface electrode 56 is provided on a second principal face of the semiconductor substrate 52. That is, the semiconductor element 20 is a vertical semiconductor element including a pair of electrodes 24, 26 across the semiconductor substrate 22 and the semiconductor element 50 is a vertical semiconductor element including a pair of electrodes 54, 56 across the semiconductor substrate 52. Note that, in FIGS. 3, 4, the front-surface electrodes 24, 54 and the signal electrodes 28, 58 are placed below the semiconductor substrates 22, 52, and the back-surface electrodes 26, 56 are placed above the semiconductor substrates 22, 52.

As an example, the semiconductor elements 20, 50 in the present embodiment are reverse conducting-insulated gate bipolar transistors (RC-IGBTs), for example, and the semiconductor substrates 22, 52 are made of silicon (Si). In the semiconductor elements 20, 50, the front-surface electrodes 24, 54 function as an emitter electrode, and the back-surface electrodes 26, 56 function as a collector electrode. Further, the signal electrodes 28, 58 include, for example, a gate signal electrode, a sense emitter electrode, a kelvin emitter electrode, a temperature sense electrode, and the like. Note that the number of signal electrodes 28, 58 and their functions are not limited to those exemplified in the present embodiment. As another example, the semiconductor elements 20, 50 may be other types of power semiconductor elements such as a metal-oxide-semiconductor field-effect transistor (MOSFET). Further, a material for forming the semiconductor substrates 22, 52 is not limited to silicon and may be other semiconductors such as silicon carbide (SiC) or nitride semiconductor, for example. Further, the semiconductor elements 20, 50 may be replaced with a combination of two or more semiconductor elements such as a combination of a diode and an IGBT (or MOSFET).

The semiconductor device 10 further includes a first conductor plate 30 and a second conductor plate 40. The first conductor plate 30 and the second conductor plate 40 are made of a conductive material such as copper or other metals. The first conductor plate 30 is laminated on the first semiconductor element 20. A bottom face 30b of the first conductor plate 30 is connected to the back-surface electrode 26 of the first semiconductor element 20 inside the sealing body 12. The first conductor plate 30 is joined to the first semiconductor element 20 via a solder adhesive layer 38, although the first conductor plate 30 and the first semiconductor element 20 are not limited to this. Note that one or more conductive members may be provided between the first conductor plate 30 and the first semiconductor element 20. A top face 30a of the first conductor plate 30 is exposed on a top face 12a of the sealing body 12. Hereby, the first conductor plate 30 not only constitutes a part of an electric circuit connected to the first semiconductor element 20, but also functions as a heat sink that releases heat of the first semiconductor element 20 to outside.

The second conductor plate 40 faces the first conductor plate 30 across the first semiconductor element 20. A top face 40a of the second conductor plate 40 is connected to the front-surface electrode 24 of the first semiconductor element 20 inside the sealing body 12. Hereby, the second conductor plate 40 is connected to the first conductor plate 30 via the first semiconductor element 20. The second conductor plate 40 is joined to the first semiconductor element 20 via a solder adhesive layer 48, although the second conductor plate 40 and the first semiconductor element 20 are not limited to this. Note that one or more conductive members may be provided between the second conductor plate 40 and the first semiconductor element 20. A bottom face 40b of the second conductor plate 40 is exposed on a bottom face 12b of the sealing body 12. Hereby, the second conductor plate 40 not only constitutes a part of the electric circuit connected to the first semiconductor element 20, but also functions as a heat sink that releases heat of the first semiconductor element 20 to outside.

The first power terminal 14 is connected to the first conductor plate 30 inside the sealing body 12. That is, the first power terminal 14 is electrically connected to the back-surface electrode 26 (the collector electrode, in this case) of the first semiconductor element 20. The second power terminal 15 is connected to the second conductor plate 40. That is, the second power terminal 15 is electrically connected to the front-surface electrode 24 (the emitter electrode, in this case) of the first semiconductor element 20. The first semiconductor element 20 is electrically inserted between the first power terminal 14 and the second power terminal 15, and the first semiconductor element 20 can turn on and off a current flowing from the first power terminal 14 to the second power terminal 15. Further, the first semiconductor element 20 includes a reflux diode, so that the first semiconductor element 20 can continuously allow a current to flow from the second power terminal 15 to the first power terminal 14. The second power terminal 15 is formed integrally with the second conductor plate 40. Note that the second power terminal 15 may be a member independent from the second conductor plate 40 and may be joined to the second conductor plate 40.

In the meantime, the first power terminal 14 is a member separate from the first conductor plate 30 and is joined to the first conductor plate 30. Generally, the first power terminal 14 includes a body portion 14a and a joining portion 14b. The body portion 14a of the first power terminal 14 extends inside and outside the sealing body 12 along the first direction X. The joining portion 14b extends from the body portion 14a along the second direction Y. The first power terminal 14 is joined to a terminal connecting portion 32 of the first conductor plate 30 at the joining portion 14b. The joining portion 14b is provided in one end 14c of the body portion 14a, the one end 14c being placed inside the sealing body 12, although the joining portion 14b is not limited to this. The joining portion 14b is provided on a first side of the one end 14c of the body portion 14a, and a chamfer 14d is provided on a second side of the one end 14c.

The semiconductor device 10 further includes a third conductor plate 60 and a fourth conductor plate 70. The third conductor plate 60 and the fourth conductor plate 70 are made of a conductive material such as copper or other metals. The third conductor plate 60 is laminated on the second semiconductor element 50. A bottom face 60b of the third conductor plate 60 is connected to the back-surface electrode 56 of the second semiconductor element 50 inside the sealing body 12. The third conductor plate 60 is joined to the second semiconductor element 50 via a solder adhesive layer 68, although the third conductor plate 60 and the second semiconductor element 50 are not limited to this. One or more conductive members may be provided between the third conductor plate 60 and the second semiconductor element 50. A top face 60a of the third conductor plate 60 is exposed on the top face 12a of the sealing body 12. Hereby, the third conductor plate 60 not only constitutes a part of an electric circuit connected to the second semiconductor element 50, but also functions as a heat sink that releases heat of the second semiconductor element 50 to outside.

The fourth conductor plate 70 faces the third conductor plate 60 across the second semiconductor element 50. A top face 70a of the fourth conductor plate 70 is connected to the front-surface electrode 54 of the second semiconductor element 50 inside the sealing body 12. Hereby, the fourth conductor plate 70 is connected to the third conductor plate 60 via the second semiconductor element 50. The fourth conductor plate 70 is joined to the second semiconductor element 50 via a solder adhesive layer 78, although the fourth conductor plate 70 and the second semiconductor element 50 are not limited to this. Note that one or more conductive members may be provided between the fourth conductor plate 70 and the second semiconductor element 50. A bottom face 70b of the fourth conductor plate 70 is exposed on the bottom face 12b of the sealing body 12. Hereby, the fourth conductor plate 70 not only constitutes a part of the electric circuit connected to the second semiconductor element 50, but also functions as a heat sink that releases heat of the second semiconductor element 50 to outside.

The second conductor plate 40 is connected to the third conductor plate 60 inside the sealing body 12. Hereby, the second power terminal 15 is also electrically connected to the back-surface electrode 56 (the collector electrode, in this case) of the second semiconductor element 50, as well as the front-surface electrode 24 of the first semiconductor element 20. As an example, the second conductor plate 40 is connected to the third conductor plate 60 via a joint 80. One part of the joint 80 is formed integrally with the second conductor plate 40, and another part of the joint 80 is formed integrally with the third conductor plate 60. These parts are joined to each other via a solder adhesive layer 82. The third power terminal 16 is connected to the fourth conductor plate 70. That is, the third power terminal 16 is electrically connected to the front-surface electrode 54 (the emitter electrode, in this case) of the second semiconductor element 50. The second semiconductor element 50 is electrically inserted between the second power terminal 15 and the third power terminal 16, and the second semiconductor element 50 can turn on and off a current flowing from the second power terminal 15 to the third power terminal 16. Further, the second semiconductor element 50 includes a reflux diode, so that the second semiconductor element 50 can continuously allow a current to flow from the third power terminal 16 to the second power terminal 15. The third power terminal 16 is formed integrally with the fourth conductor plate 70. Note that the third power terminal 16 may be a member independent from the fourth conductor plate 70 and may be joined to the fourth conductor plate 70.

Respective first signal terminals 18 are connected to respective signal electrodes 28 of the first semiconductor element 20 inside the sealing body 12. The first signal terminals 18 are connected to an external gate drive circuit (not shown) so as to transmit a gate drive signal output from the gate drive circuit to the first semiconductor element 20. Further, the first signal terminals 18 transmit a temperature signal and a current signal output from the first semiconductor element 20 to the gate drive circuit. Similarly, respective second signal terminals 19 are connected to respective signal electrodes 58 of the second semiconductor element 50 inside the sealing body 12. The second signal terminals 19 are also connected to an external gate drive circuit (not shown) so as to transmit a gate drive signal output from the gate drive circuit to the second semiconductor element 50. Further, the second signal terminals 19 transmit a temperature signal and a current signal output from the second semiconductor element 50 to the gate drive circuit. In the present embodiment, the first signal terminals 18 are directly soldered to the signal electrodes 28 of the first semiconductor element 20. However, as another example, the first signal terminals 18 may be connected to the signal electrodes 28 of the first semiconductor element 20 via bonding wires or other connection members. This also applies to the connection between the second signal terminals 19 and the signal electrodes 58 of the second semiconductor element 50.

In such a configuration, the semiconductor device 10 of the present embodiment has a circuit structure in which two RC-IGBTs are serially-connected between the first power terminal 14 and the third power terminal 16, and the second power terminal 15 is connected between the two RC-IGBTs. Accordingly, the semiconductor device 10 can constitute upper and lower arms in a power converter circuit such as a DC-DC converter or an inverter, for example. Note that a plurality of first semiconductor elements 20 may be provided in parallel between the first conductor plate 30 and the second conductor plate 40, and a plurality of second semiconductor elements 50 may be provided in parallel between the third conductor plate 60 and the fourth conductor plate 70. Hereby, a rated current (allowable current) of the semiconductor device 10 can be raised, for example.

Figure 2:
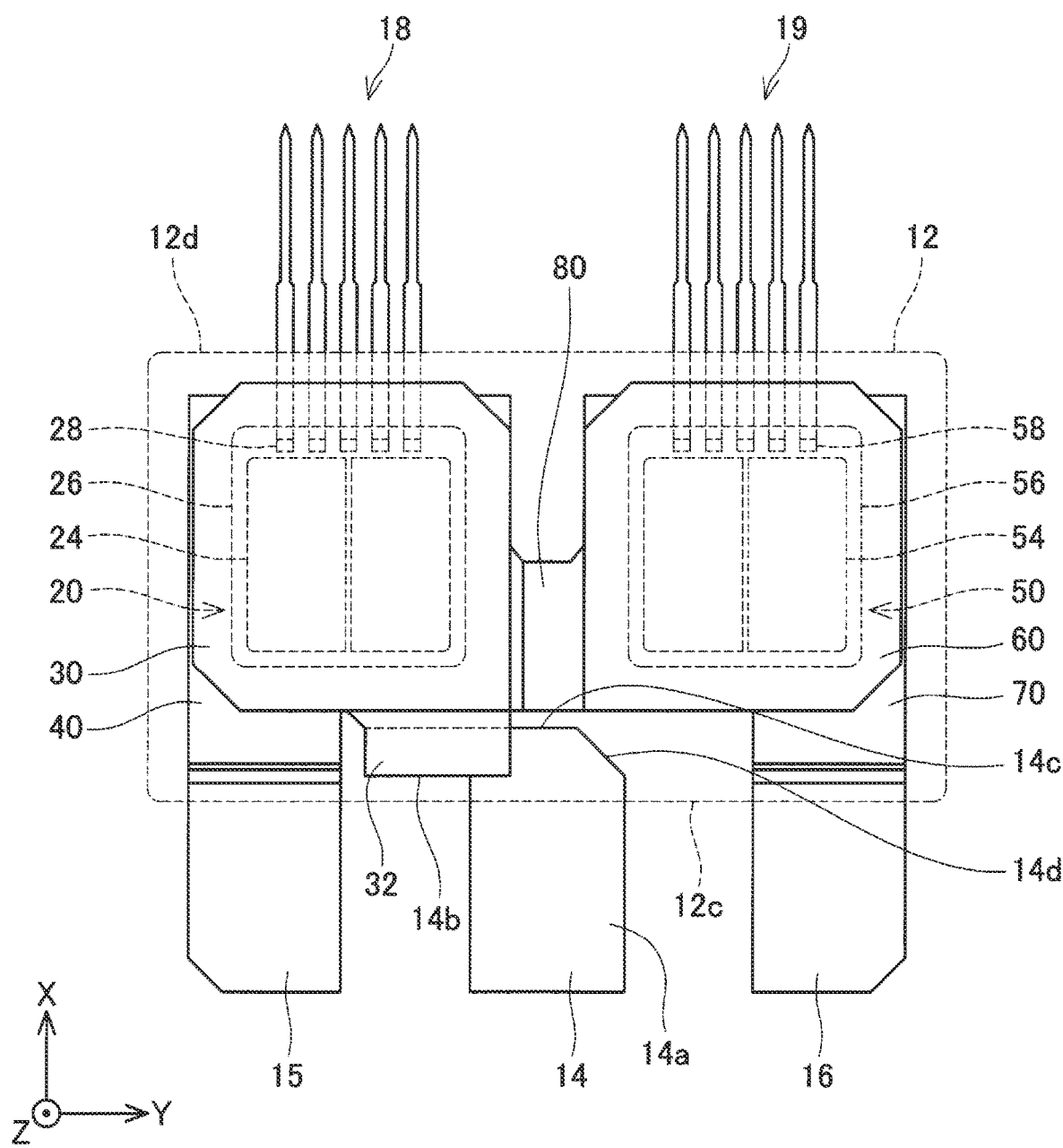
FIG. 2 is a plan view illustrating an inner structure of the semiconductor device 10 of Embodiment 1 without illustration of a sealing body 12.
Figure 3:
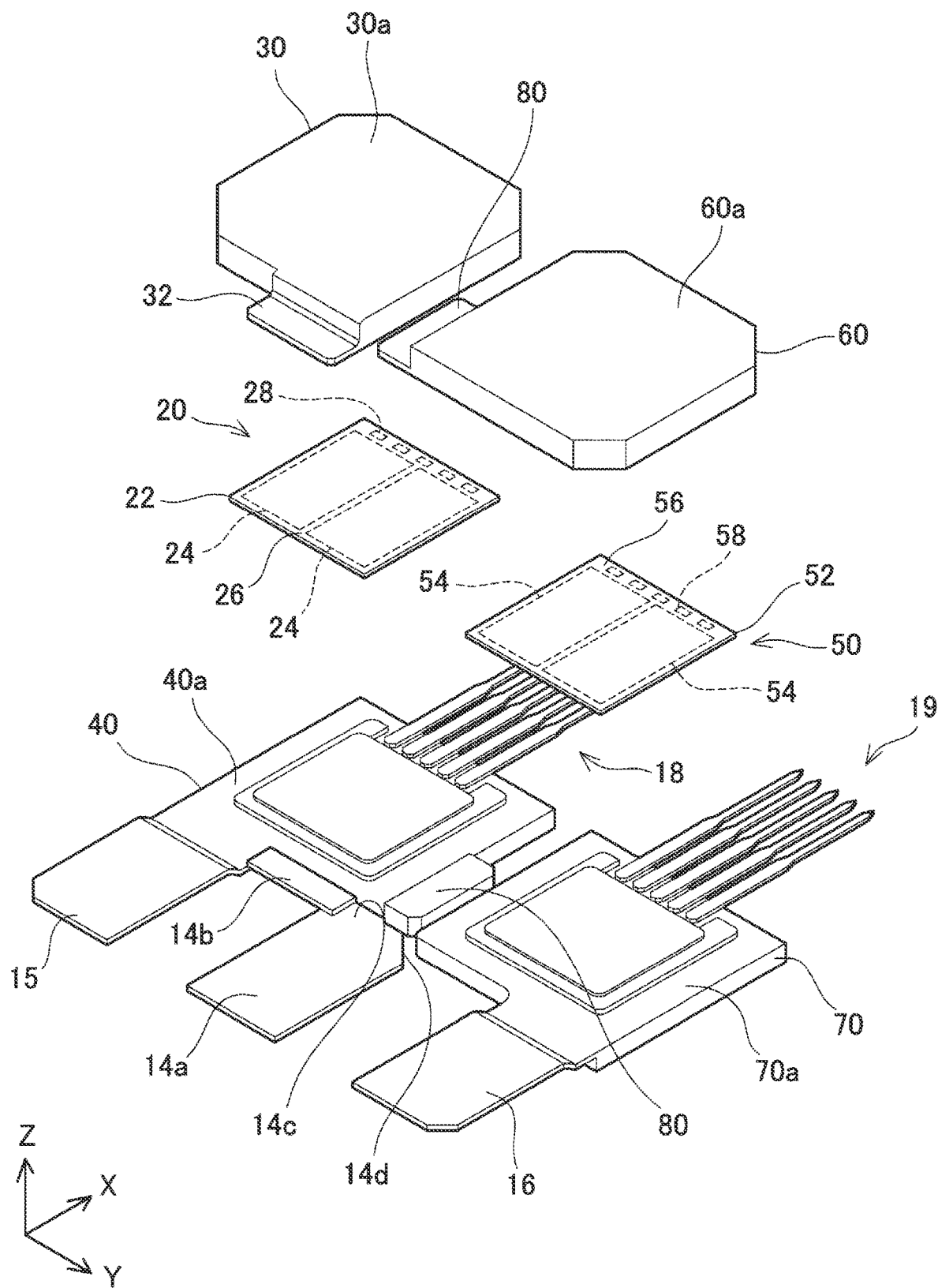
FIG. 3 is an exploded perspective view illustrating the inner structure of the semiconductor device 10 of Embodiment 1.
Figure 4:
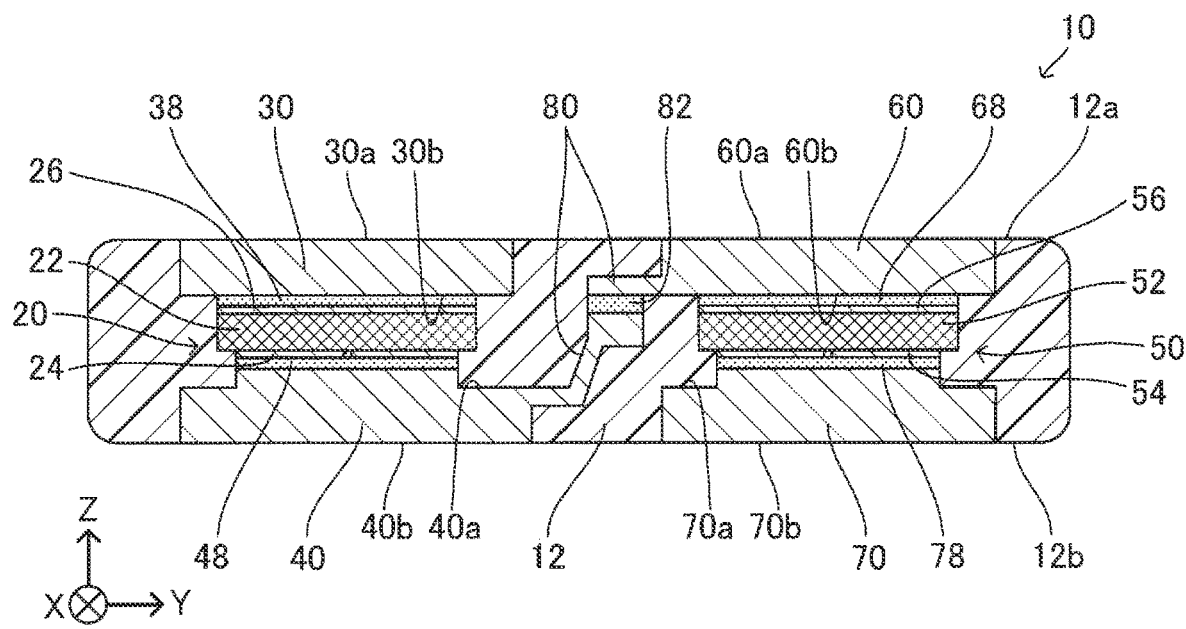
FIG. 4 is a sectional view taken along a line IV-IV in FIG. 1.
Figure 5:
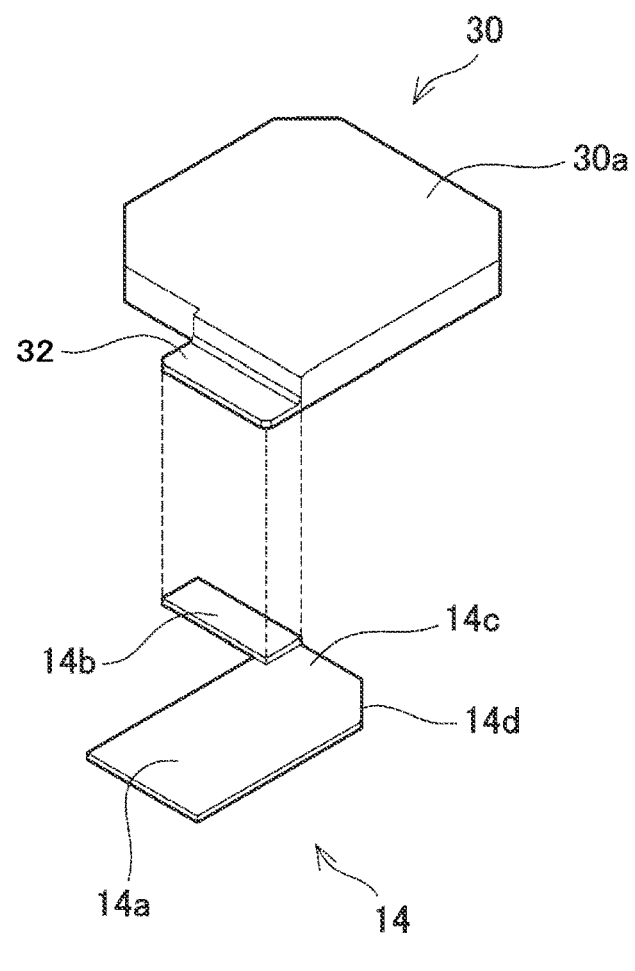
FIG. 5 is a view illustrating a joining relationship between a first power terminal 14 and a first conductor plate 30.

In the semiconductor device 10 of the present embodiment, as illustrated in FIGS. 2, 4, 5, the first power terminal 14 includes the body portion 14a extending inside and outside the sealing body 12 along the first direction X, and the joining portion 14b extending inside the sealing body 12 along the second direction Y different from the first direction X. The first power terminal 14 is joined to the terminal connecting portion 32 of the first conductor plate 30 at the joining portion 14b. When the joining portion 14b of the first power terminal 14 extends in a direction different from the body portion 14a of the first power terminal 14, the joining portion 14b functions like an anchor inside the sealing body 12. Hereby, even when a large tensile force is applied to the body portion 14a projecting outside the sealing body 12, the first power terminal 14 is firmly held by the sealing body 12. That is, the fixing strength of the first power terminal 14 by the sealing body 12 improves.

The second direction Y where the joining portion 14b of the first power terminal 14 extends is perpendicular to the first direction X where the body portion 14a of the first power terminal 14 extends, although the second direction Y is not limited to this. When the second direction Y is perpendicular or generally perpendicular (90 degrees±10 degrees) to the first direction X as such and an angular difference between the first direction X and the second direction Y is sufficiently large, the joining portion 14b can effectively function as an anchor. Note that, as another example, the angular difference between the first direction X and the second direction Y may be less than 90 degrees, and the angular difference may be, for example, 45 degrees or more or 60 degrees or more.

The first power terminal 14 is a plate-shaped member, and the second direction Y where the joining portion 14b extends is generally perpendicular to a thickness direction of the first power terminal 14, although the first power terminal 14 is not limited to this. In such a configuration, when a tensile force is applied to the first power terminal 14, for example, the joining portion 14b can hardly deform with respect to the body portion 14a, so that the first power terminal 14 is firmly fixed to the sealing body 12. Note that, as another example, the joining portion 14b of the first power terminal 14 may be formed by bending the plate-shaped first power terminal 14 in its thickness direction. In this case, the second direction Y where the joining portion 14b extends is generally in parallel to the thickness direction of the first power terminal 14.

In the semiconductor device 10 of the present embodiment, the joining portion 14b of the first power terminal 14 is placed between the first side face 12c of the sealing body 12 and the first conductor plate 30 in a plan view (see FIG. 2). With such a configuration, the joining portion 14b can be provided so as to be relatively long along the first side face 12c of the sealing body 12. This makes it possible to further raise the fixing strength of the first power terminal 14 by the sealing body 12. The "plan view" as used herein indicates a case where the semiconductor device 10 is viewed along a third direction Z (that is, a direction perpendicular to the first conductor plate 30 and the first semiconductor element 20) where the first semiconductor element 20 and the first conductor plate 30 are laminated and a positional relationship in the third direction is ignored.

In the semiconductor device 10 of the present embodiment, the joining portion 14b of the first power terminal 14 is placed between the body portion 14a of the first power terminal 14 and the second power terminal 15 in a plan view (see FIG. 2). Particularly, the joining portion 14b of the first power terminal 14 extends from the body portion 14a of the first power terminal 14 toward the second power terminal 15. In such a configuration, a distance between the body portion 14a of the first power terminal 14 and the second power terminal 15 (particularly, a creeping distance along the first side face 12c of the sealing body 12) is increased, thereby making it possible to raise an insulating property between the body portion 14a of the first power terminal 14 and the second power terminal 15. Particularly, since the first conductor plate 30 to which the first power terminal 14 is connected and the second conductor plate 40 to which the second power terminal 15 is connected face each other across the first semiconductor element 20, the distance between the first power terminal 14 and the second power terminal 15 easily becomes short in general. In contrast, when the joining portion 14b of the first power terminal 14 is provided between the body portion 14a of the first power terminal 14 and the second power terminal 15, the distance between the first power terminal 14 and the second power terminal 15 can be made large.

In the semiconductor device 10 of the present embodiment, the first power terminal 14 is placed between the second power terminal 15 and the third power terminal 16 in a plan view (see FIG. 2). In such a configuration, the second power terminal 15 and the third power terminal 16 are placed so as to sandwich the first power terminal 14, so that the structural symmetry of the semiconductor device 10 across the first power terminal 14 is raised. Hereby, the fixing strength of the first power terminal 14 by the sealing body 12 improves significantly. Particularly, when the first power terminal 14, the second power terminal 15, and the third power terminal 16 are placed on the same plane, the structural symmetry of the semiconductor device 10 can be raised more.

Figure 6:
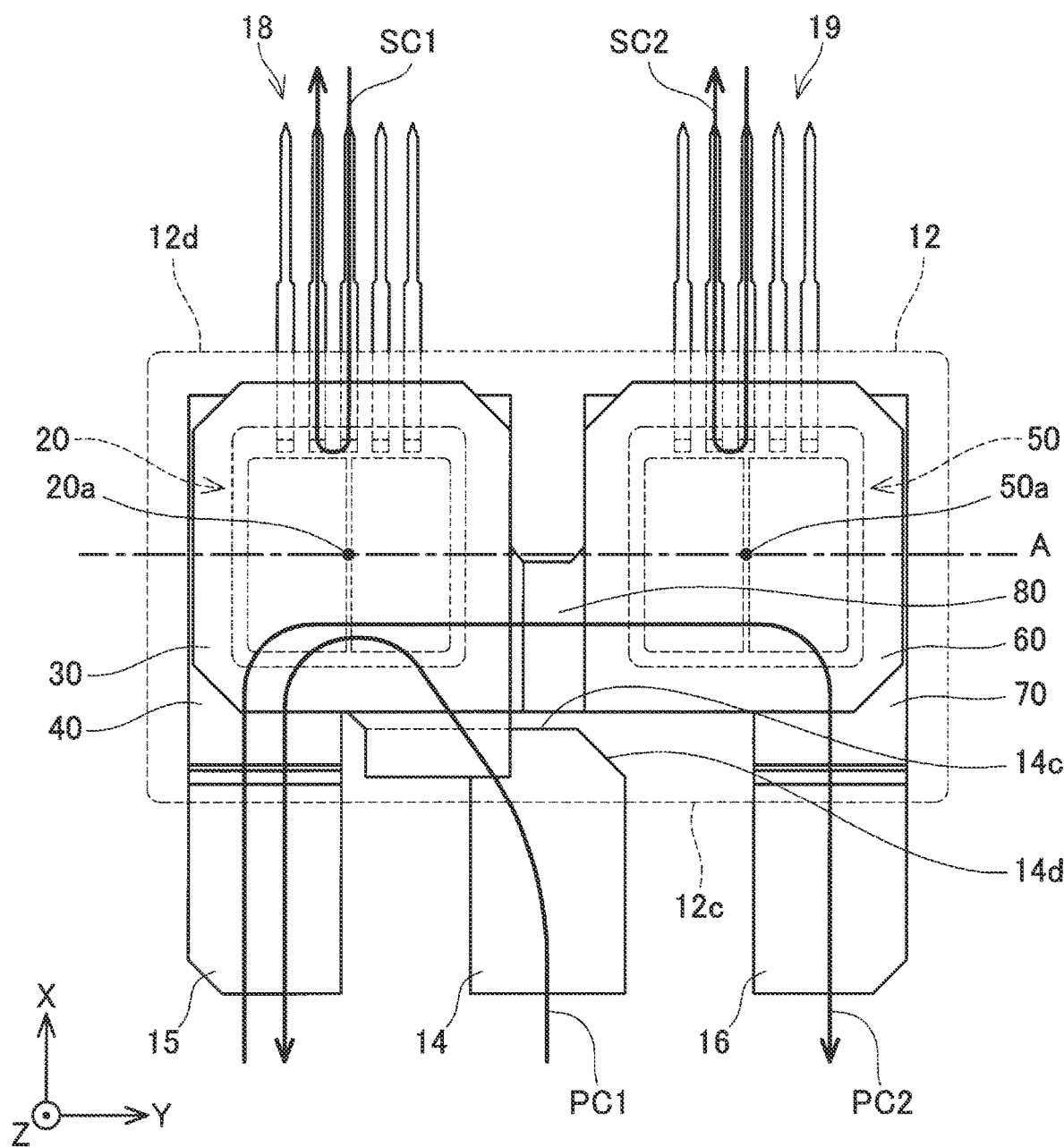
FIG. 6 is a view schematically illustrating power-line currents PC1, PC2 and signal-line currents SC1, SC2 in the semiconductor device 10.

In the semiconductor device 10 of the present embodiment, while the first power terminal 14, the second power terminal 15, and the third power terminal 16 project from the first side face 12c of the sealing body 12, the first signal terminals 18 and the second signal terminals 19 project from the second side face 12d on the opposite side of the sealing body 12 from the first side face 12c. Hereby, the first signal terminals 18 and the second signal terminals 19 are placed so as to be relatively distanced from the power terminals 14, 15, 16. In such a configuration, as illustrated in FIG. 6, paths for power-line currents PC1, PC2 flowing through the semiconductor device 10 and paths for signal-line currents SC1, SC2 flowing through the semiconductor device 10 are formed so as to be relatively distanced from each other. Accordingly, it is possible to restrain occurrence of noise in the signal-line currents SC1, SC2 flowing into the first signal terminal 18 and the second signal terminal 19, the noise being caused due to the power-line currents PC1, PC2 flowing through the power terminals 14, 15, 16.

In the semiconductor device 10 of the present embodiment, the third conductor plate 60 is connected to the second conductor plate 40 via the joint 80 as described above. The joint 80 is placed between the second conductor plate 40 and the third conductor plate 60 in a plan view. In addition, as illustrated in FIG. 6, the joint 80 is placed on the same side as the first side face 12c of the sealing body 12 with respect to a straight-line A passing through respective centers 20a, 50a of the first semiconductor element 20 and the second semiconductor element 50. In such a configuration, the joint 80 is placed near the second power terminal 15 and the third power terminal 16, so that the path for the power-line current PC2 flowing between the second power terminal 15 and the third power terminal 16 via the joint 80 becomes short, thereby making it possible to restrain a loss caused in the semiconductor device 10 and heat generation caused due to the loss.

In the semiconductor device 10 of the present embodiment, members having the same shape are employed for the first conductor plate 30 and the third conductor plate 60, and the first conductor plate 30 may be placed with a posture rotated by 90 degrees from the third conductor plate 60. Note that a part serving as the terminal connecting portion 32 in the first conductor plate 30 corresponds to a part of the joint 80 in the third conductor plate 60. In such a configuration, common components can be used, so that a manufacturing cost of the semiconductor device 10 can be reduced, for example.

In the semiconductor device 10 of the present embodiment, the joining portion 14b of the first power terminal 14 is provided in the one end 14c of the body portion 14a of the first power terminal 14, as described above. The joining portion 14b is provided on the first side of the one end 14c of the body portion 14a, and the chamfer 14d is formed on the second side of the one end 14c (see FIGS. 2, 3, 5, and so on). When the chamfer 14d is formed in the one end 14c of the body portion 14a, an adhesion property between the first power terminal 14 and the sealing body 12 increases, so that the fixing strength of the first power terminal 14 by the sealing body 12 becomes higher. Further, in a manufacturing stage of the semiconductor device 10, a material (e.g., resin) flows smoothly inside a mold when the sealing body 12 is molded, for example. Note that the chamfer 14d may be an R-chamfer (fillet) or may be a C-chamfer.

Some specific examples of the disclosure have been described in detail. However, the examples are for illustration only and do not limit the scope of the claims. The technique described in the scope of the claims includes the foregoing examples with various modifications and changes. Technical elements described in the present specification or the drawings exhibit a technical usability solely or in various combinations.

What is claimed is:

1. A semiconductor device comprising:
   a first semiconductor element;
   a first conductor plate laminated on the first semiconductor element and connected to the first semiconductor element;
   a first power terminal connected to the first conductor plate, the first power terminal including a body portion extending in a first direction and a joining portion extending in a second direction different from the first direction, the joining portion being connected to the first conductor plate, the joining portion is provided in a first end that is one end of the body portion, the joining portion extends from a first side which is one side of the first end in an orthogonal direction to the first direction, the other side of the first end in the orthogonal direction to the first direction is chamfered; and
   a sealing body configured to seal the first semiconductor element, the first conductor plate, the joining portion, and a part of the body portion, the sealing body having a first surface that is a surface from which the body portion projects and a second surface that is a surface placed on an opposite side of the sealing body from the first surface.

2. The semiconductor device according to claim 1, wherein the joining portion is placed between the first surface of the sealing body and the first conductor plate in a plan view.

3. The semiconductor device according to claim 1, further comprising a first signal terminal projecting from the second surface of the sealing body, the first signal terminal being connected to the first semiconductor element inside the sealing body.

4. The semiconductor device according to claim 1, further comprising:
   a second conductor plate sealed by the sealing body, the second conductor plate facing the first conductor plate across the first semiconductor element, the second conductor plate being connected to the first conductor plate via the first semiconductor element; and
   a second power terminal projecting from the first surface of the sealing body, the second power terminal being connected to the second conductor plate inside the sealing body, wherein at least a part of the joining portion is placed between the body portion and the second power terminal in a plan view.

5. The semiconductor device according to claim 4, further comprising:
   a second semiconductor element sealed by the sealing body;
   a third conductor plate laminated on the second semiconductor element, the third conductor plate being connected to the second semiconductor element inside the sealing body;
   a fourth conductor plate facing the third conductor plate across the second semiconductor element, the fourth conductor plate being connected to the third conductor plate via the second semiconductor element; and
   a third power terminal projecting from the first surface of the sealing body, the third power terminal being connected to the fourth conductor plate inside the sealing body, wherein the first power terminal is placed between the second power terminal and the third power terminal in the plan view.

6. The semiconductor device according to claim 5, wherein:
   the third conductor plate is connected to the second conductor plate via a joint; and the joint is placed between the second conductor plate and the third conductor plate and is placed between the first surface and a straight line passing through a center of the first semiconductor element and a center of the second semiconductor element in the plan view.

7. The semiconductor device according to claim 6, further comprising a second signal terminal projecting from the second surface of the sealing body, the second signal terminal being connected to the second semiconductor element inside the sealing body.

8. The semiconductor device according to claim 5, wherein:
a shape of the first conductor plate and a shape of the third conductor plate are the same; and
the first conductor plate is placed at an angle 90 degrees shifted from the third conductor plate.

9. The semiconductor device according to claim 1, wherein the second direction is generally perpendicular to the first direction.

10. The semiconductor device according to claim 1, wherein:
the first power terminal has a plate-shape; and
the second direction is generally perpendicular to a thickness direction of the first power terminal.

11. The semiconductor device according to claim 1, wherein the first power terminal is formed integrally with the first conductor plate.

12. A semiconductor device comprising:
a first semiconductor element;
a first conductor plate laminated on the first semiconductor element and connected to the first semiconductor element;
a first power terminal connected to the first conductor plate, the first power terminal including a body portion extending in a first direction and a joining portion, the body portion being connected to the first conductor plate, the joining portion is provided in a first end that is one end of the body portion, the joining portion extends from a first side which is one side of the first end in an orthogonal direction to the first direction, the other side of the first end in the orthogonal direction to the first direction is chamfered;
a sealing body configured to seal the first semiconductor element, the first conductor plate, and a part of the body portion, the sealing body having a first surface that is a surface from which the body portion projects;
a second conductor plate sealed by the sealing body, the second conductor plate facing the first conductor plate across the first semiconductor element, the second conductor plate being connected to the first conductor plate via the first semiconductor element;
a second power terminal projecting from the first surface of the sealing body, the second power terminal being connected to the second conductor plate inside the sealing body;
a second semiconductor element sealed by the sealing body;
a third conductor plate laminated on the second semiconductor element, the third conductor plate being connected to the second semiconductor element inside the sealing body;
a fourth conductor plate facing the third conductor plate across the second semiconductor element, the fourth conductor plate being connected to the third conductor plate via the second semiconductor element; and
a third power terminal projecting from the first surface of the sealing body, the third power terminal being connected to the fourth conductor plate inside the sealing body, wherein:
the first power terminal is placed between the second power terminal and the third power terminal in a plan view;
the third conductor plate is connected to the second conductor plate via a joint; and
the joint is placed between the second conductor plate and the third conductor plate and is placed between the first surface and a straight line passing through a center of the first semiconductor element and a center of the second semiconductor element in the plan view.

13. A semiconductor device comprising:
a first semiconductor element;
a first conductor plate laminated on the first semiconductor element;
a first power terminal including a body portion extending in a first direction and a joining portion, the first power terminal being connected to the first conductor plate, the joining portion is provided in a first end that is one end of the body portion, the joining portion extends from a first side which is one side of the first end in an orthogonal direction to the first direction, the other side of the first end in the orthogonal direction to the first direction is chamfered;
a second conductor plate laminated on the first semiconductor element, the second conductor plate facing the first conductor plate across the first semiconductor element;
a second power terminal extending in the first direction, the second power terminal being connected to the second conductor plate on a side, in the first direction, where the first power terminal is connected to the first conductor plate;
a first signal terminal connected to the first semiconductor element on an opposite side, in the first direction, from the side where the first power terminal is connected to the first conductor plate;
a second semiconductor element separated from the first semiconductor element;
a third conductor plate laminated on the second semiconductor element on a side, in a laminating direction, where the first conductor plate is laminated on the first semiconductor element, the laminating direction being a direction where the first semiconductor element and the first conductor plate are laminated, the third conductor plate being connected to the second conductor plate via a joint, the joint being placed between the first power terminal and a straight line passing through a center of the first semiconductor element and a center of the second semiconductor element in the first direction;
a fourth conductor plate laminated on the second semiconductor element, the fourth conductor plate facing the third conductor plate across the second semiconductor element; and
a third power terminal extending in the first direction, the third power terminal being connected to the fourth conductor plate on the side, in the first direction, where the first power terminal is connected to the first conductor plate.

* * * * *

UNITED STATES PATENT AND TRADEMARK OFFICE
CERTIFICATE OF CORRECTION

PATENT NO. : 10,699,997 B2
APPLICATION NO. : 16/260552
DATED : June 30, 2020
INVENTOR(S) : Takanori Kawashima It is certified that error appears in the above-identified patent and that said Letters Patent is hereby corrected as shown below:

On the Title Page

Item (71), Applicant 1, City, delete "Kariya, Aichi-pref" and insert --Kariya-city, Aichi-pref--, therefor.

Item (72), Inventor 1, City, delete "Anjo" and insert --Anjo-shi Aichi-ken--, therefor.

Item (73), Assignee 1, City, delete "Kariya, Aichi-pref" and insert --Kariya-city, Aichi-pref--, therefor.

Signed and Sealed this
Fifteenth Day of December, 2020

Andrei Iancu
*Director of the United States Patent and Trademark Office*